United States Patent [19]
Kanada et al.

[11] Patent Number: 5,363,795
[45] Date of Patent: Nov. 15, 1994

[54] CZOCHRALSKI CRYSTAL PULLING PROCESS AND AN APPARATUS FOR CARRYING OUT THE SAME

[75] Inventors: Hiroshi Kanada; Katsumi Nishizaki; Masahiro Murakami; Teruyuki Sekine; Yasuyuki Seki, all of Chiba, Japan; Kazuhiko Echizenya; Yusei Hidaka, both of Santa Clara, Calif.

[73] Assignee: Kawasaki Steel Corporation, Japan

[21] Appl. No.: 71,591

[22] Filed: Jun. 3, 1993

Related U.S. Application Data

[63] Continuation of Ser. No. 755,011, Sep. 4, 1991, abandoned.

[51] Int. Cl.⁵ ............................................. C30B 15/12
[52] U.S. Cl. ...................................... 117/13; 117/208
[58] Field of Search .................. 156/600, 617.1, 618.1, 156/619.1, 620.4; 422/248, 249

[56] References Cited

U.S. PATENT DOCUMENTS

| | | | |
|---|---|---|---|
| 3,342,559 | 9/1967 | Dermatis | 23/273 |
| 4,330,362 | 5/1982 | Zulehner | 422/249 |
| 4,911,780 | 3/1990 | Morioka et al. | 156/617.1 |
| 4,957,713 | 9/1990 | Kraretsky et al. | 156/617.1 |
| 5,009,863 | 4/1991 | Shima et al. | 156/617.1 |
| 5,139,750 | 8/1992 | Shima et al. | 422/249 |

FOREIGN PATENT DOCUMENTS

| | | |
|---|---|---|
| 0340941 | 11/1989 | European Pat. Off. . |
| 0425065 | 5/1991 | European Pat. Off. . |
| 0450089 | 10/1991 | European Pat. Off. . |
| 1316707 | 12/1961 | France . |
| 2513976 | | Japan . |
| 63303887 | 12/1988 | Japan . |
| 2163367 | 2/1986 | United Kingdom . |

Primary Examiner—R. Bruce Breneman
Assistant Examiner—Felisa Garrett
Attorney, Agent, or Firm—Austin R. Miller

[57] ABSTRACT

A Czochralski crystal pulling apparatus for carrying out the Czochralski crystal pulling process is provided with a reflecting plate for reflecting radiation heat radiated from the surface of a molten material contained in a crucible toward a contact region of the surface of the molten material contiguous with the wall of the crucible to heat the molten material in the contact region so that the temperature of the molten material in the contact region may be prevented to reach the solidifying point. The reflecting plate is suspended by wires from cross beams so that the radiation heat transfer from the surface of a crystal toward a surrounding radiation heat transfer surface of a furnace may not be intercepted. The surface of the molten material is maintained on a level above the upper end of a high temperature region of a heater so that the surface of the molten material may be kept in comparatively low temperature to promote the crystal growth rate.

13 Claims, 10 Drawing Sheets

CZOCHRALSKI CRYSTAL PULLING PROCESS AND AN APPARATUS FOR CARRYING OUT THE SAME

This application is a continuation of application Ser. No. 07/755,011 now abandoned, filed Sep. 4, 1991.

BACKGROUND OF THE INVENTION

1. Field of the Invention

The present invention relates to a Czochralski crystal pulling process of producing a large single crystal, and a crystal pulling apparatus for carrying out the same.

2. Description of the Related Art

In a Czochralski crystal pulling process, a single crystal held by a seed chuck is pulled up by a seed wire from a crucible supported on a susceptor and filled with a molten material. Crystal pulling speed can be increased by lowering the temperature of the molten material or lowering the temperature of the crystal being pulled up.

In producing a single crystal by the Czochralski crystal pulling process, the temperature distribution on the surface of the molten material, in general, shows that the crystal bottom stays in the solidifying temperature and the molten material temperature along the radial surface increases gradually from the crystal periphery and then decreases to a temperature slightly above the solidifying point at the radially outermost position where the molten material is in contact with the wall of the crucible. Accordingly, if the temperature of the molten material is held at a comparatively low temperature to increase the crystal growth rate in pulling up a crystal by the Czochralski crystal pulling process, the temperature of the molten material in a region near the the wall of the crucible may reach the solidifying point and hence the single crystal cannot stably be pulled up.

There has been an idea that the crystal growth rate can be increased if the temperature of the crystal being pulled up is lowered by intercepting the radiation heat transfer from the crucible or the molten material to the crystal. Techniques intended to increase the growth rate by intercepting the radiation heat transfer from the crucible and the molten material to the crystal have been proposed. For example, a technique (1) proposed in Japanese Patent Publication (Kokoku) No. Sho 57-40119 (U.S. Pat. No. 4,330,362) and a technique (2) proposed in Japanese Patent Publication (Kokoku) No. Sho 58-1080 (U.S. Pat. No. 4,330,361) cover a crucible and a molten material partially with a metal radiation screen, a technique (3) proposed in Japanese Patent Publication (Kokoku) No. Hei 2-31040 employs a radiation screen of a multilayer insulating screening construction, and a technique (4) proposed in Japanese Patent Laid-open (Kokai) No. Sho 64-72984 (U.S. Pat. No. 4,956,153) employs an annular, heat-resistant, heat-insulating plate.

The techniques (1) to (4) intercept the radiation heat transfer from the crucible and the molten material to the crystal to promote the cooling of the crystal so that the crystal growth rate is increased. In the practical application of these techniques, however, the cooling of the crystal is impeded, so the crystal growth rate is reduced. This problem will be explained hereunder.

In pulling up a crystal without using any radiation screen, a just crystallized portion of the crystal is exposed to radiation heat of about 1300° C. emitted by the wall of the crucible and radiation heat of about 1400° C. emitted by the molten material. As the crystal is pulled up, the crystal radiate heat toward a cylindrical tube of a temperature on the order of 500°. In pulling up a crystal using a radiation screen, the crystal is shielded from the direct radiation heat radiated from the wall of the crucible and the molten material; however, the crystal is surrounded by the radiation screen of a temperature on the order of 1000° C., which is higher than that of the cylindrical tube. Accordingly, the radiation screen impedes the heat radiation of the crystal or, rather keeps the crystal at a high temperature. Since the temperature of a portion of the crystal facing the wall of the crucible or the surface of the molten material, in general, is 1000° C. or higher, and hence the radiation heat shielding effect of the radiation screen on the cooling of the crystal is insignificant. Thus, the effect of the radiation screen on impeding the heat radiation of the crystal is greater than the effect of the same on shielding the crystal from the radiation heat radiated from the wall of the crucible and the molten material and, consequently, the radiation screen increases the temperature of the crystal. Accordingly, the previously proposed techniques (1) to (4) are not very effective on increasing the crystal growth rate because the radiation screen has an effect of keeping the crystal at a high temperature and suppressing the crystal growth rate rather than an effect of increasing the crystal growth rate.

A technique (5) proposed in Japanese Patent Laid-open (Kokai) No. Sho 55-56098 (U.S. Pat. No. 4,378,269) employs an annular radiation screening disk for covering the upper surfaces of the molten material, the crucible and the heater, and a cooling cylinder disposed on the annular radiation screening disk. Since the annular radiation screening disk covers the surface of the molten material entirely, a portion of the crystal in which crystal growth is in process, namely, a portion of the crystal in contact with the molten material, is prevented from cooling. If the temperature of the molten material is lowered to increase crystal growth rate, the molten material solidifies in a region near the wall of the crucible and, consequently, the crystal growth rate is reduced rather than increased.

SUMMARY OF THE INVENTION

Accordingly, it is an object of the present invention to provide a Czochralski crystal pulling process capable of maintaining the surface of a molten material contained in a crucible at a lowest possible temperature by suppressing the solidification of the molten material in the vicinity of the wall of the crucible to increase crystal growth rate, and to provide a crystal pulling apparatus for carrying out the Czochralski crystal pulling process.

Another object of the present invention is to provide a Czochralski crystal pulling process capable of reducing the temperature of a crystal being pulled up from a molten material contained in a crucible by promoting heat radiation from the surface of the crystal to stably increase the crystal growth rate, and to provide a crystal pulling apparatus for carrying out the Czochralski crystal pulling process.

The object of the invention is achieved by a Czochralski crystal pulling process incorporating the improvement comprising suspending a reflecting plate by wires so as to reflect the radiation heat radiated from the surface of the molten material toward a region in which the surface of the molten material is contiguous with the crucible, and pulling up a single crystal.

A crystal pulling apparatus suitable for carrying out the foregoing Czochralski crystal pulling process comprises a furnace, a crucible, and an annular reflecting plate having a reflecting surface and suspended from the upper part of the furnace so that the annular reflecting plate is disposed inside the crucible between the top of the crucible wall and the surface of the molten material with its reflecting surface facing the surface of the molten material contained in the crucible at a region in which the surface of the molten material is contiguous with the crucible.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Crystal pulling apparatus embodying the present invention will be described in comparison with the conventional Czochralski crystal pulling apparatus. Prior to the description of the crystal pulling apparatus embodying the present invention, the conventional crystal pulling apparatus will be described.

Figure 8:
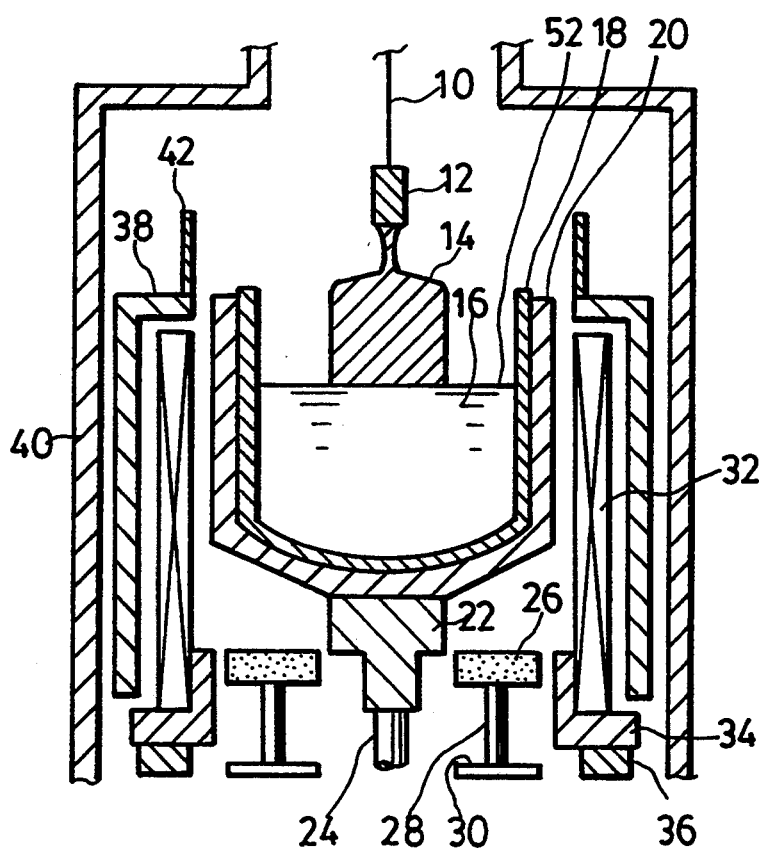
FIGS. 8 is a longitudinal sectional view of a conventional Czochralski crystal pulling apparatus.

Referring to FIG. 8, in producing a crystal by a conventional Czochralski crystal pulling apparatus, a molten material 16 is contained in a crucible 18 supported for rotation on a susceptor 20, and a seed chuck 12 holding a crystal 14 is pulled up by a seed wire 10. The crucible 18 is surrounded by a furnace wall 40 provided on its inner surface with a heater 32 to heat the molten material 16. Heat insulator 26 is supported on support posts 28 placed on base plate 30 in the bottom of the furnace to intercept downward heat radiation. The heater 32 is supported on a supporting member 34. A current is supplied to the heater 32 through electrodes 36.

Figure 9:
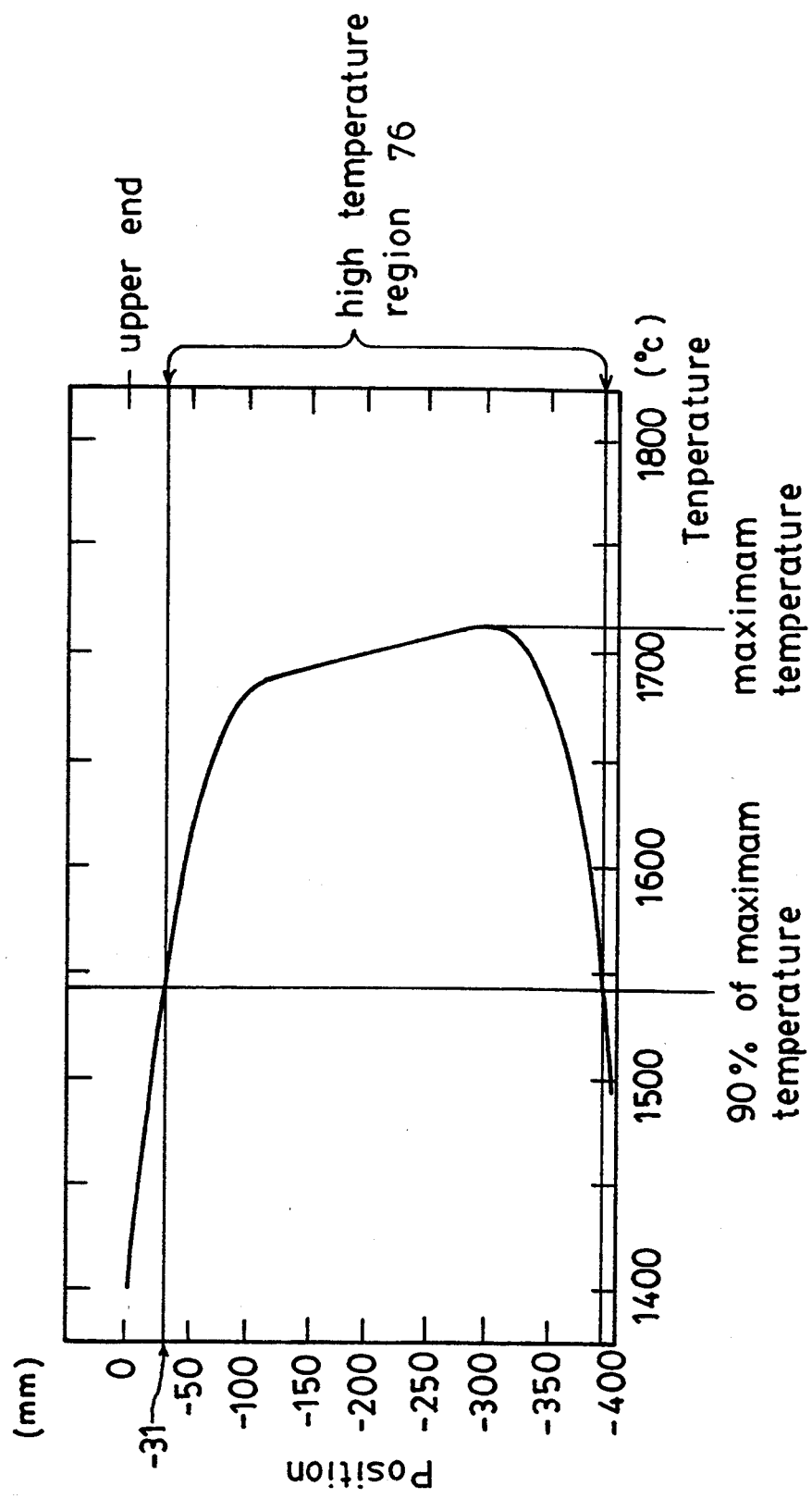
FIG. 9 is a graph showing temperature distribution in a heater included in the crystal pulling apparatus embodying the present invention;.

FIG. 9 shows temperature distribution in the heater with respect to a vertical direction. In FIG. 9, temperature T (°C.) is put to the right on a horizontal axis and distance from the upper end of the heater is illustrated downward on a vertical axis. As indicated by a temperature curve in FIG. 9, the temperatures of the upper region and the lower region of the heater are lower than the temperature of the high temperature region of the same. In this specification the high temperature region 76 is defined as a region of a heater in which the surface temperature is not less than 90% of the maximum temperature thereof.

Figure 2:
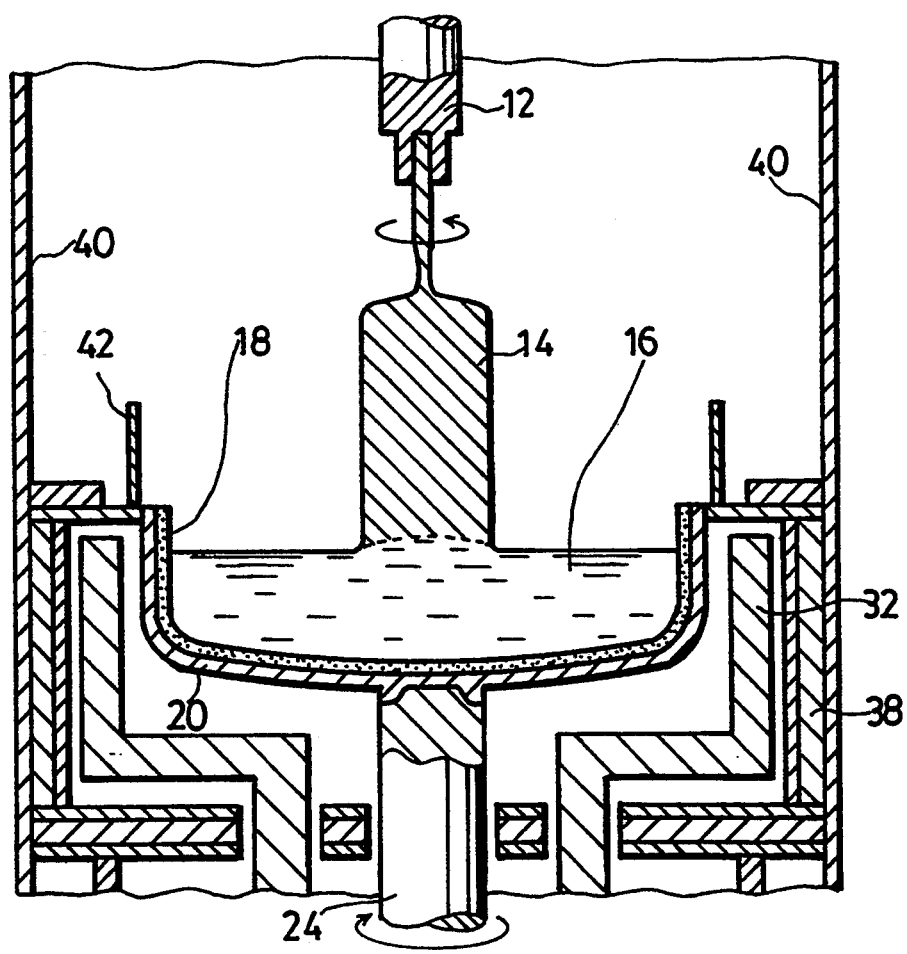
FIG. 2 is a sectional view of a conventional Czochralski crystal pulling apparatus not provided with any radiation screen.

In a Czochralski crystal pulling apparatus not provided with any radiation screen shown in FIG. 2, a just crystallized portion of the crystal 14 is exposed to radiation heat radiated from the wall of the crucible 18 at about 1300° C. and radiation heat radiated from the molten material 16 at about 1440° C., and radiates toward a cylindrical tube 42 made of graphite at about 500° C.

Figure 3:
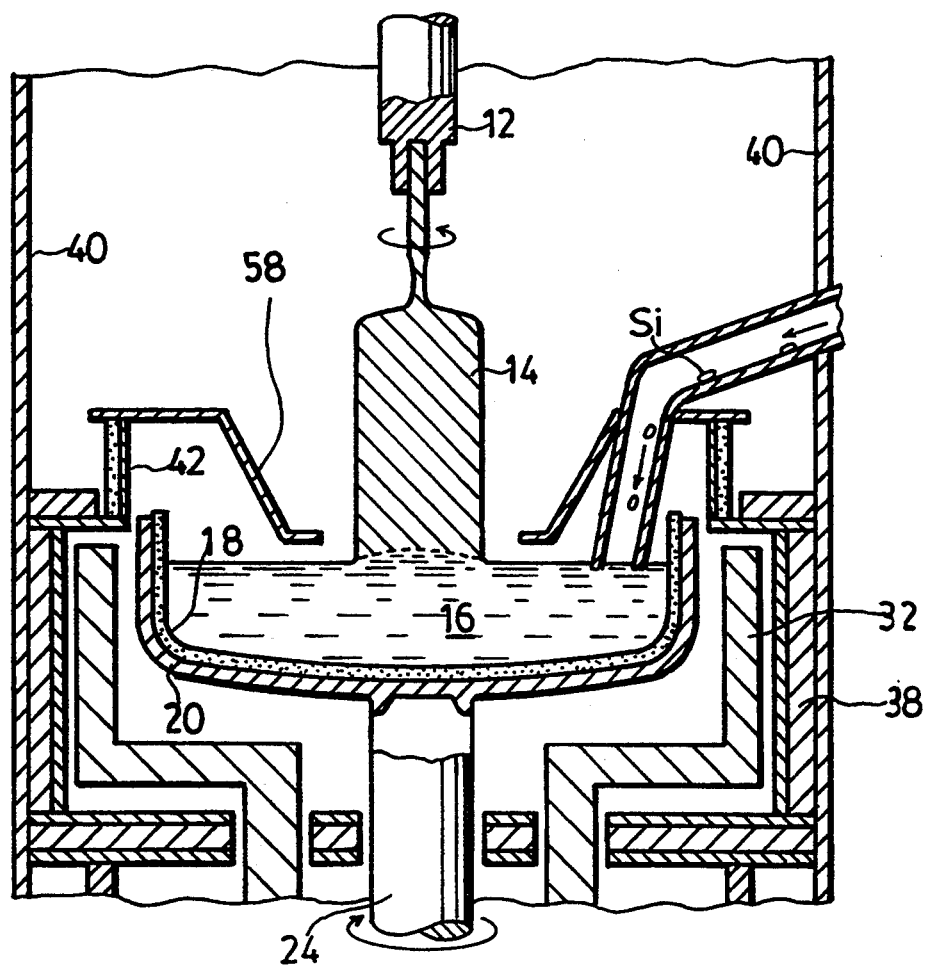
FIG. 3 is a sectional view of a conventional Czochralski crystal pulling apparatus provided with a radiation screen.

In a Czochralski crystal pulling apparatus provided with a radiation screen 58 shown in FIG. 3, the crystal 14 may be intercepted from direct radiation heat radiated from the wall of the crucible 18 and the molten material 16. However, the crystal 14 is exposed to heat radiated by the radiation screen 58 at about 1000° C., so that the heat radiation from the crystal 14 is impeded. The heating effect of the radiation screen 58 on the crystal 14 is higher than the heat shielding effect of the same on the crystal 14, and hence the crystal growth rate cannot be increased.

Figure 1:
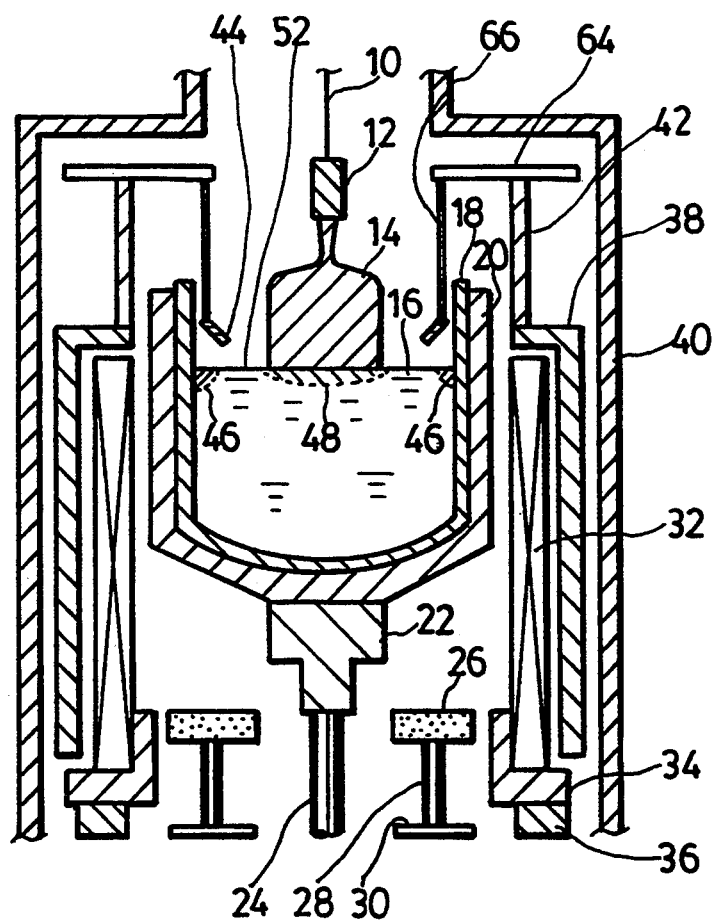
FIG. 1 is a longitudinal sectional view of a crystal pulling apparatus in a preferred embodiment according to the present invention.

Referring to FIG. 1 showing a crystal pulling apparatus in a first embodiment according to the present invention, if the temperature of a molten material contained in a crucible 18 is lowered to increase crystal growth rate without a reflecting plate 44, the temperature of the molten material 16 in a contact region 46 in the vicinity of the periphery of the surface 52 of the molten material 16 may reach the solidifying point to impede the growth of a crystal 14. The crystal pulling apparatus in this embodiment is provided with an open reflecting plate 44 suspended to reflect a portion of radiation heat radiated from the surface 52 of the molten material 16 toward the contact region 46 of the surface of the molten material 16 to heat the molten material in the contact region 46 in order to keep the temperature of the molten material 16 in the contact region 46 in a higher level. Consequently, stable operation can be obtained, because the temperature of the surface 52 of the molten material 16 near the crucible 18 is prevented from reaching the solidifying point. The reduction in the temperature of the surface 52 of the molten material 16 reduces radiation heat radiated from the surface 52 of the molten material 16 toward the crystal 14. The reflecting plate 44 is open and suspended by wires 66 so that the circumference of the crystal 14 is exposed satisfactorily to surrounding radiation heat transfer surface of a comparatively low temperature. The crystal 14 radiates heat from its circumference, so that cooling of the crystal 14 is promoted and the crystal growth rate can be increased. There is no restriction on the number, shape and material of the wires 66 provided that the wires 66 have sufficient strength, are sufficiently heat-resistant and do not obstruct the radiation of heat from the crystal 14. Though there are illustrated in FIG. 1 wires suspended from a cylindrical tube 42, the present invention is not limited to this embodiment. For instance, the cylindrical tube can be modified to be standing bars and then a pulled crystal may be exposed to a furnace wall of about 200° C. which promotes a radiation heat transfer effect from the crystal.

In another aspect of the present invention, the surface 52 of the molten material 16 is maintained at a level above the upper end of the high temperature region 76 of the heater 32, the temperature of which is higher than those of other portions of the heater 32, to reduce heat transferred from the heater 32 to a portion of the molten material 16 in the vicinity of the surface thereof relative to heat transferred to the other portion of the same so that the temperature of the molten material in the vicinity of the surface thereof is lower than that of the other portion of the same. Since the contact region 46 in the vicinity of the peripheral region of the surface 52 of the molten material is heated by reflecting radiation heat toward the peripheral region by the reflecting plate 44 to prevent the temperature of the molten material 16 in the vicinity of the wall of the crucible 18 from reaching the solidifying point, the crystal growth rate can easily be increased by lowering the temperature of the molten material 16 the surface thereof by adjusting the position of the surface 52 of the molten material 16 relative to the heater 32.

There is no restriction on the shape of the reflecting plate 44 provided that the reflecting plate 44 is able to reflect radiation heat radiated from the surface 52 of the molten material 16 effectively toward the contact region 46, does not impede the convection of gas over the surface 52 of the molten material 16 and does not obstruct heat radiation from the crystal 14. For example, the reflecting plate 44 may be any one of the reflecting plates as shown in FIGS. 5(a) to 5(f) having a straight cross section, a polygonal cross section, a curved cross section or a cross section of a combination of those cross sections.

The reflecting plate 44 is suspended by wires and located inside the crucible between the top of the crucible wall and the surface of the molten material. This enables the temperature of the molten material near the crucible wall to be kept at a comparatively high level from the solidifying point as well as the radiation from the pulled up crystal surface being kept unintercepted. As a result, it can be achieved to pull up a single crystal at a high growing rate, maintaining the temperature of the molten material in a low level as compared with prior processes and promoting an excellent cooling effect of the pulled up crystal, while preventing the temperature of the molten material near the crucible wall from reaching the solidifying point.

EXAMPLE 1

Figure 4:
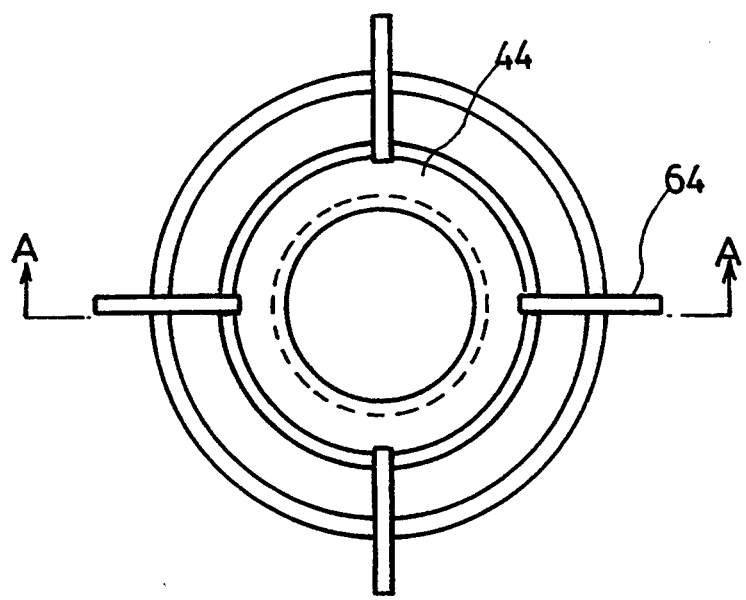
FIGS. 4(a) and 4(b) are a plane view and a longitudinal sectional view of a reflecting plate and a suspending member employed in the crystal pulling apparatus embodying the present invention.
Figure 4:
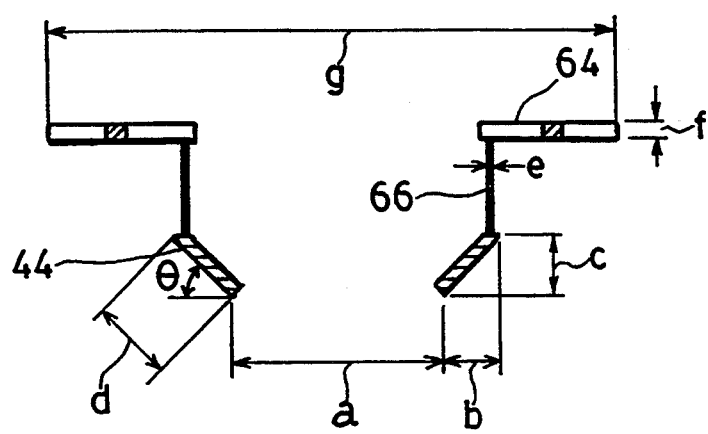
Figure 5A:
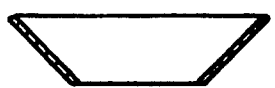
FIGS. 5(a) to 5(f) are sectional views of different reflecting plates in accordance with the present invention.
Figure 5B:
Figure 5C:
Figure 5D:
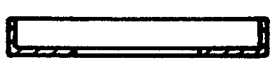
Figure 5E:
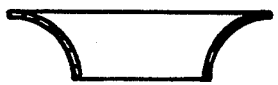
Figure 5F:
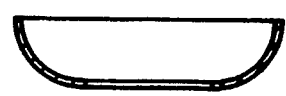

A silicon single crystal 14 of 6 in. in diameter was produced by a Czochralski crystal pulling process by the crystal pulling apparatus shown in FIG. 1. The quartz crucible 18 of 16 in. in diameter was charged with 45 kg of polycrystalline silicon. The reflecting plate 44 having the shape of an inverted frustum of a right circular cone was suspended by wires 66 from cross beams 64 supported on a cylindrical tube 42 mounted on a heat insulating wall 38 to reflect radiation heat radiated from the surface 52 of the molten material 16 toward the contact region 46 so that the molten material 16 in the contact region 46 is heated locally. Since the open reflecting plate 44 is suspended by the wires 66 from the cross beams 64, radiation heat transfer from the surface of the crystal 14 is not obstructed. The shapes and dimensions of the reflecting plate 44, the wires 66 and the cross beams 64 are shown in FIGS. 4(a) and 4(b). The reflecting plate 44, the structure suspending the reflecting plate 44 are formed of molybdenum.

In FIG. 4(b), a=300 mm, b=35 mm, c=35 mm, d=50 mm, e=2 mm$\phi$, f=15 mm, g=530 mm and $\theta$=45°.

The reflecting plate 44 was disposed with the lower end thereof located 20 mm above the surface of the molten material 16 and with the upper end thereof located 55 mm below the upper end of the crucible 18 at the beginning of the crystal growth.

The reflecting plate 44 formed of molybdenum has high reflectance and excellent heat resistance. A reflecting plate formed of a material other than molybdenum may be employed provided that the reflecting plate has high reflectance and excellent heat resistance.

FIG. 9 shows measured temperature distribution in the heater 32 of the crystal pulling apparatus with respect to a vertical direction. The temperature of a portion of the heater 32 at a distance of 31 mm from the upper end of the heater 32 was 90% of the maximum temperature. A portion of the heater 32 under the portion at a distance of 31 mm is estimated as the high temperature region 76 in this case.

When a single crystal is pulled up without a reflecting plate, the surface temperature of the molten material 16 at a position at a radial distance of 120 mm from the center of the surface 52 was measured as 1440° C.

In an embodiment, the level of the surface 52 of the molten material 16 was adjusted to a position 32 mm below the upper end of the heater 32 so that the surface 52 of the molten material 16 is in a range corresponding to the high temperature region 76 of the heater 32, and the crystal was pulled up under the condition of keeping the surface temperature of the molten material at a radial distance of 120 mm from the center of the surface at about 1435° C. Crystals were produced by the conventional Czochralski crystal pulling apparatus shown in FIG. 2 and the conventional Czochralski crystal pulling apparatus provided with the radiation screen 58 shown in FIG. 3 for comparison. The conventional Czochralski crystal pulling apparatus was operated with the surface of the molten material on a level 32 mm below the upper end of the heater under the same pulling conditions as that for the crystal pulling apparatus of the present invention. The radiation screen 58 had the shape of an inverted frustum of a right circular cone. The frustum-shaped portion of the radiation screen 58 had an upper end having a diameter of 380 mm, a lower end having a diameter of 270 mm and a height of 255 mm, and the outside diameter of the flange of the radiation screen 58 was 510 mm. The radiation screen 58 was disposed with the upper end thereof located 165 mm above the upper end of the crucible 18 at the beginning of the crystal growth.

Figure 6:
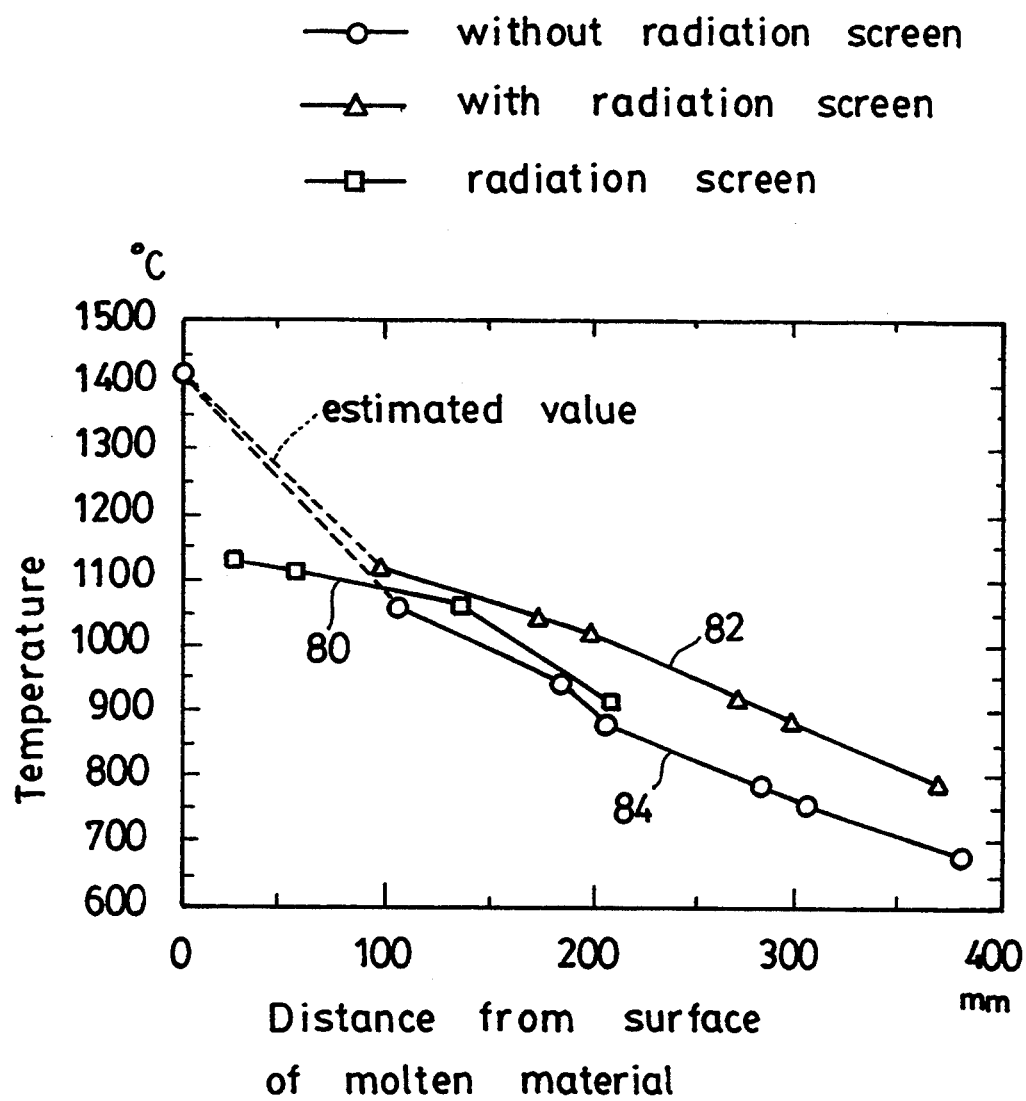
FIG. 6 is a graph showing measured temperatures of a radiation screen and a crystal on a Czochralski crystal pulling apparatus, and that of a crystal on a Czochralski crystal pulling apparatus not provided with any radiation screen.

FIG. 6 shows the results of measurement of the variation of temperature on the radiation screen 58 with the distance from the surface of the molten material, the variation of temperature on the crystal with the distance from the surface of the molten material on the Czochralski crystal pulling apparatus provided with the radiation screen 58 (FIG. 3), and the variation of temperature on the crystal with the distance from the surface of the molten material on the Czochralski crystal pulling apparatus (FIG. 2), which are indicated by curves 80, 82 and 84, respectively. As is obvious from the curves 80 and 84, the temperature of the radiation screen 58 at a position thereon is higher than that of the crystal produced without using the radiation screen 58 at the corresponding position and, as is obvious from the curves 82 and 84, the temperature of the crystal on the Czochralski crystal pulling apparatus of FIG. 3 at a position is higher than that of the crystal on the Czochralski crystal pulling apparatus of FIG. 2 at the corresponding position.

Figure 7:
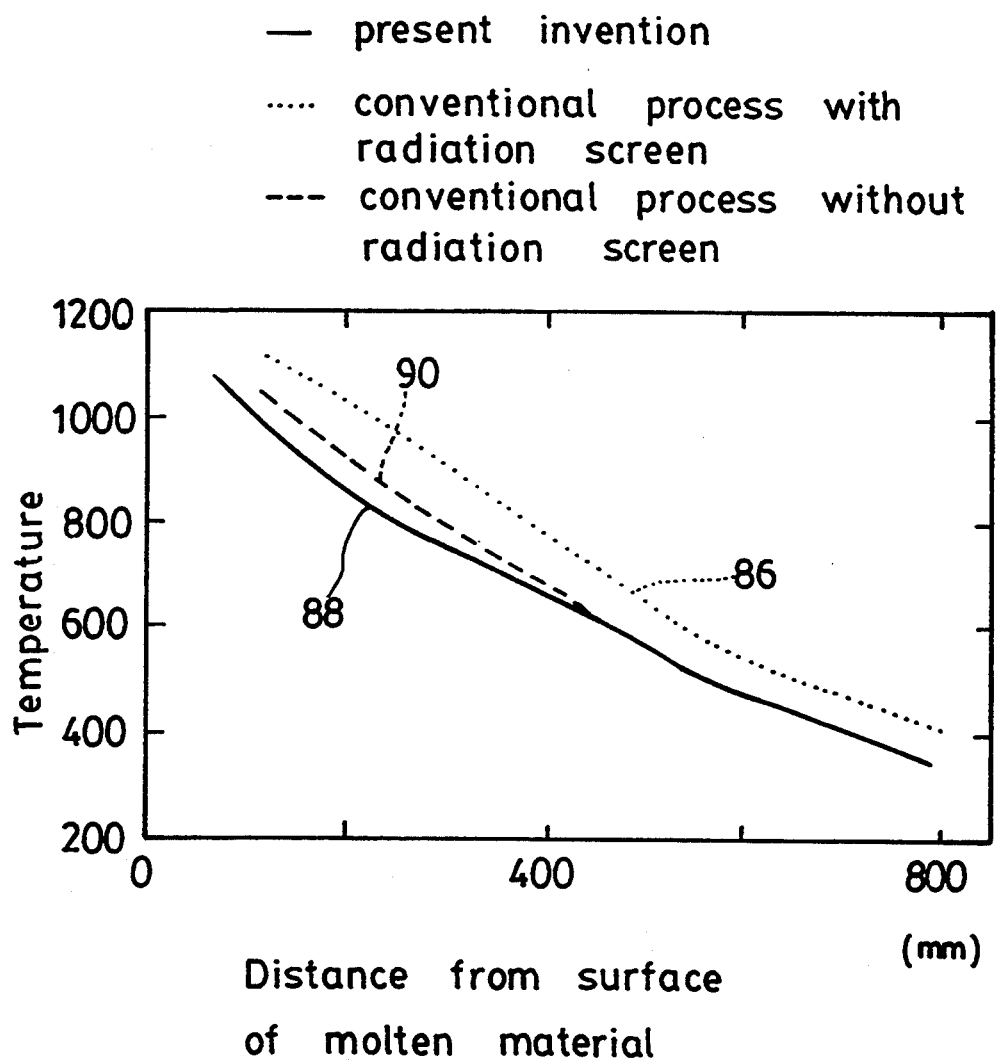
FIG. 7 is a graph showing the temperatures at different distances from the surface of a molten material, respectively, for Czochralski crystal pulling apparatus of different constructions.

FIG. 7 shows the result of measurement of the variation of temperature on the crystal on the conventional Czochralski crystal pulling apparatus of FIG. 3 with the distance from the surface of the molten material, the variation of temperature on the crystal on the crystal pulling apparatus of the present invention with the distance from the surface of the molten material, and the variation of temperature on the crystal on the conventional Czochralski crystal pulling apparatus of FIG. 2 with the distance from the surface of the molten material, which are indicated by curves 86, 88 and 90, respectively. The effect of omission of the radiation screen on the reduction of the temperature of the crystal is obvious from the comparison of the curves 86 and 88. The effect of the present invention on the reduction of the temperature of the crystal is obvious from the comparison of the curves 88 and 90. The molten material in the contact region 46 did not solidify throughout the crystal producing operation without heating the molten material at a comparatively high temperature.

Figure 10:
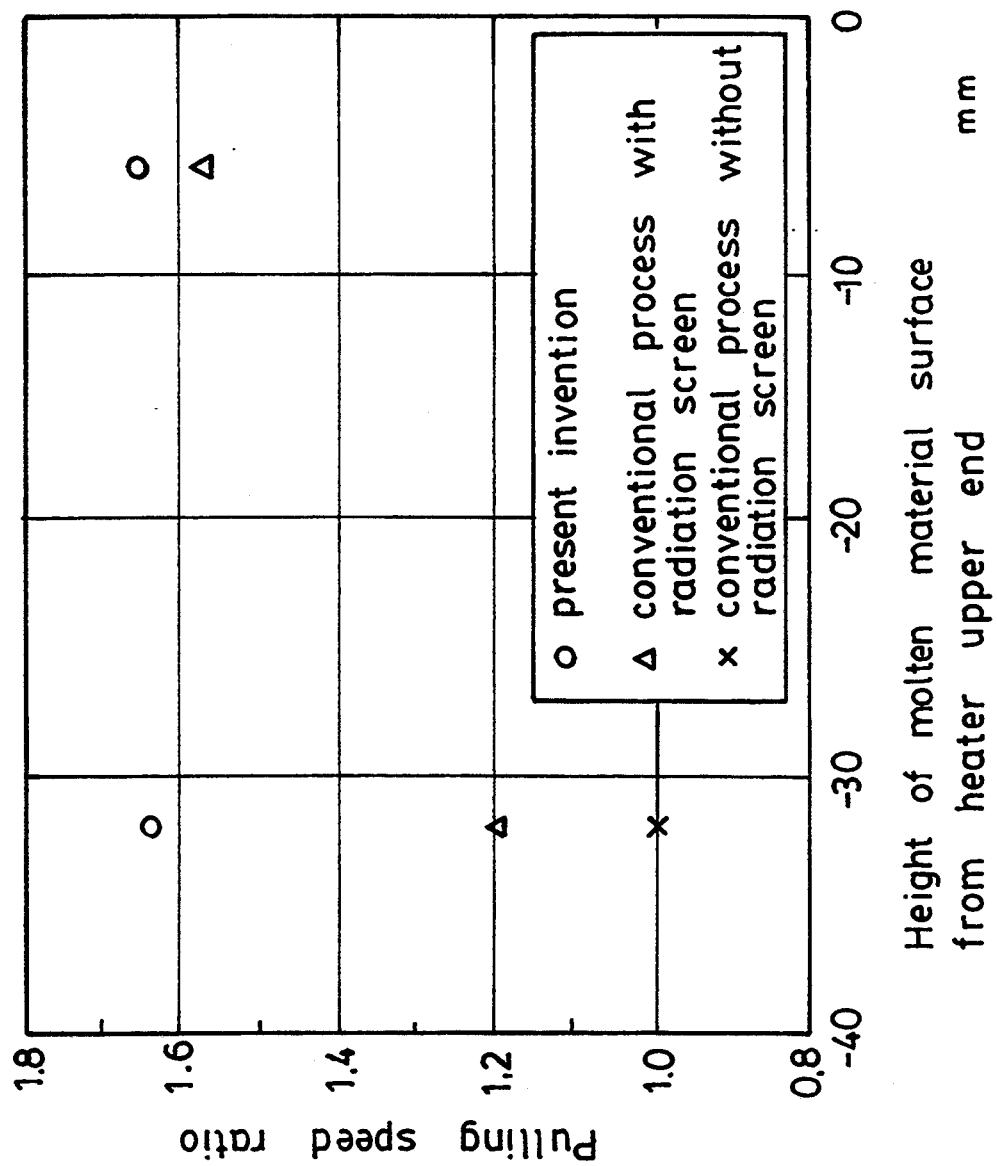
FIG. 10 is a graph showing the effect of the crystal pulling apparatus embodying the present invention.

As shown in FIG. 10, the average pulling speed of the crystal pulling apparatus of the present invention was about 1.6 times higher than that of the conventional Czochralski crystal pulling apparatus of FIG. 2 and about 1.3 times higher than that of the Czochralski crystal pulling apparatus of FIG. 3.

EXAMPLE 2

A crystal pulling apparatus in a second embodiment according to the present invention was the same as the crystal pulling apparatus in the first embodiment, except that the surface of the molten material was maintained on a level 6 mm below the upper end of the heater, and the temperature of the surface of the molten material at a position at a radial distance of 120 mm from the center of the surface was at about 1433° C. The conventional Czochralski crystal pulling apparatus shown in FIG. 3 was operated according to the same operating conditions as those for the crystal pulling apparatus of the present invention and with the surface of the molten material maintained at the same level relative to the upper end of the heater as that on which the surface of the molten material was maintained on the crystal pulling apparatus of the present invention. As shown in FIG. 10, the average crystal pulling speed of the crystal pulling apparatus in the second embodiment was 1.06 times higher than that of the conventional Czochralski crystal pulling apparatus shown in FIG. 3. When the conventional Czochralski crystal pulling apparatus shown in FIG. 2 was operated according to the same operating conditions, the molten material solidified in the contact region 46 and impeded the growth of the crystal.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A Czochralski crystal pulling process having improved pulling speed comprising: in a molten material in a crucible lowering the temperature of the crystal and that of the molten material near the crystal while maintaining the temperature at a contact region of the surface of the molten material contiguous with a side wall of the crucible slightly above its solidifying point by suspending an open reflecting plate above said molten material and thereby reflecting a portion of radiation heat radiated from the surface of the molten material contained in the crucible toward a contact region of the surface of the molten material contiguous with the side wall of the crucible, said open reflecting plate being oriented toward said contact region, thereby permitting a remaining portion of the radiation heat from the surface of the molten material and heat radiating from the crystal to radiate around said open reflecting plate and from said crucible without obstruction to facilitate cooling and pulling a single crystal upwardly from the molten material.

2. A Czochralski crystal pulling process according to claim 1, wherein the surface of the molten material is maintained at a level above a high temperature region of a heater.

3. A Czochralski crystal pulling process having improved pulling speed comprising: in a molten material in a crucible lowering the temperature of the crystal and that of a portion of said molten material positioned near the crystal while maintaining the temperature at a contact region of the surface of the molten material contiguous with a side wall of the crucible slightly above its solidifying point by reflecting a portion of radiation heat radiated from the surface of the molten material contained in the crucible toward a contact region of the surface of the molten material contiguous with the side wall of the crucible by suspending an open reflecting ring above the molten material and oriented toward said contact region, thereby providing interior space within said crucible free of any structure capable of reflecting heat toward said crystal from around said crucible, permitting a remaining portion of the radiation heat from the surface of said molten material and heat radiating from said crystal to radiate around said open ring and from said crucible without substantial obstruction thereby to facilitate cooling and pulling a single crystal upwardly from said molten material.

4. A crystal pulling apparatus for producing a crystal by a Czochralski crystal pulling process, comprising: a furnace, a crucible with a crucible wall which contains the molten material of which said crystal is formed, an annular reflecting plate located directly inside the crucible wall and between the top of the crucible wall and the surface of the molten material in the crucible to reflect a portion of the heat radiated from the surface of the molten material contained in the crucible toward a contact region of the surface of the molten material contiguous with the crucible wall, said annular reflecting plate being spaced apart from said crucible wall and spaced apart from said crystal to cause a remaining portion of the radiation heat and heat radiating from the crystal to radiate outwardly of the crucible to facilitate crystal cooling, and wires suspending said annular reflecting plate from an upper portion of the furnace, said wires having open spaces between them to permit heat radiation from the crystal surface toward a surrounding radiation heat transfer surface of the furnace.

5. A crystal pulling apparatus according to claim 3, wherein the upper portion of the furnace provides a horizontal suspension framework having a slim circular bar and four radially crossing beams attached thereto, wherein inner ends of upper ends of said suspending wires are connected, respectively.

6. A crystal pulling apparatus according to claim 3, wherein the annular reflecting plate is shaped in the form of an inverted frustum of a right circular cone.

7. A crystal pulling apparatus according to claim 3, wherein the annular reflecting plate is shaped in the form of a flat plate ring.

8. A crystal pulling apparatus according to claim 3, wherein the annular reflecting plate is shaped in the form of a combination of an inner hollow cylinder and an outer flat plate ring.

9. A crystal pulling apparatus according to claim 5, wherein the annular reflecting plate is shaped in the form of a combination of an inner flat plate ring and an outer cylindrical wall.

10. A crystal pulling apparatus according to claim 5, wherein the annular reflecting plate is shaped in the form of a frustum of a concave surfaced conical shell.

11. A crystal pulling apparatus according to claim 5, wherein the annular reflecting plate is shaped in the form of a frustum of a convex surfaced conical shell.

12. A crystal pulling apparatus for rapidly producing a crystal by a Czochralski crystal pulling process comprising:
 a crucible having a side wall;
 means for heating the crucible;
 an open annular reflecting plate located inwardly of the side wall and above the surface of a molten material in the crucible to reflect a portion of heat radiated from the surface of the molten material toward a contact area of the surface of the molten material contiguous with the wall of the crucible, the plate occupying an otherwise substantially open space between the side wall of the crucible and the crystal; and
 means suspending the annular reflecting plate above the molten material, said suspending means having openings sized sufficient to substantially avoid interception of a remaining portion of heat radiating from the surface of the molten metal and the surface of the crystal toward a surrounding radiation heat transfer surface of the furnace located outwardly of the crucible to facilitate crystal cooling.

13. A crystal pulling apparatus for rapidly producing a crystal by a Czochralski crystal pulling process comprising:
 a crucible having a bottom portion and a side wall and containing a molten material from which said crystal is upwardly pulled;
 means for heating said crucible and said molten material, including a furnace located outwardly of said crucible;
 an open reflecting ring spaced inwardly of said crucible side wall and spaced above the surface of said molten material in said crucible, said open ring being angled to reflect a portion of heat radiated from the surface of said molten material toward a contact area of the surface of said molten material contiguous with said crucible side wall,
 said open reflecting ring occupying an otherwise open space between said crucible side wall and said crystal, said open space being free of structure capable of reflecting heat toward said crystal from around said crucible; and
 means suspending said reflecting ring above said molten material, said suspending means having openings sized to transmit a remaining portion of heat radiating from the surface of said molten metal and the surface of said crystal toward a surrounding radiation heat transfer surface of said furnace located outwardly of said crucible to thereby facilitate crystal cooling.

* * * * *

UNITED STATES PATENT AND TRADEMARK OFFICE
CERTIFICATE OF CORRECTION

PATENT NO. : 5,363,795
DATED : November 15, 1994
INVENTOR(S) : Hiroshi Kanada, Katsumi Nishizaki, Masahiro Murakami, Teruyuki Sekine, Yasuyuki Seki, Kazuhiko Echizenya, Yusei Hidaka It is certified that error appears in the above-indentified patent and that said Letters Patent is hereby corrected as shown below:

In Column 5, at line 25, after "16", please insert --at--.

In Column 9, at line 3, please change "3" to --4--;
at line 9, please change "3" to --4--;
at line 12, please change "3" to --4--;
at line 15, please change "3" to --4--;
at line 19, please change "5" to --4--;
at line 23, please change "5" to --4--; and
at line 26, please change "5" to --4--.

Signed and Sealed this

Fourteenth Day of February, 1995

Attest:

BRUCE LEHMAN

*Attesting Officer*     *Commissioner of Patents and Trademarks*